US007073624B2

(12) United States Patent
Decanio et al.

(10) Patent No.: US 7,073,624 B2
(45) Date of Patent: Jul. 11, 2006

(54) LOUDSPEAKER BAFFLE ISOLATION SYSTEM

(75) Inventors: William Andrew Decanio, Castaic, CA (US); Paul Nelson Adley, Agoura Hills, CA (US); Robert Garrison Tice, Canyon Drive, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 397 days.

(21) Appl. No.: 10/632,452

(22) Filed: Jul. 31, 2003

(65) Prior Publication Data

US 2004/0084243 A1 May 6, 2004

Related U.S. Application Data

(60) Provisional application No. 60/399,791, filed on Jul. 31, 2002.

(51) Int. Cl.
*H05K 5/02* (2006.01)
*H05K 5/03* (2006.01)
*F16F 15/02* (2006.01)
*F16F 15/04* (2006.01)

(52) U.S. Cl. ...................................... 181/150; 181/209

(58) Field of Classification Search ................ 181/150, 181/151

See application file for complete search history.

(56) References Cited

U.S. PATENT DOCUMENTS 1,967,223 A * 7/1934 Bostwick .................... 181/173
2,076,034 A * 4/1937 Lampman ................... 248/605
2,115,653 A * 4/1938 Snyder ....................... 248/635
2,455,891 A * 12/1948 Flanagan .................... 267/141
2,520,575 A * 8/1950 Cain .......................... 248/632
3,052,435 A * 9/1962 Roller ........................ 248/569
3,128,999 A * 4/1964 Schmitt ...................... 267/153
3,771,621 A * 11/1973 Goettl ........................ 181/151
4,066,058 A * 1/1978 Anderkay ............... 123/198 E
4,289,929 A * 9/1981 Hathaway ................... 381/351
4,306,708 A * 12/1981 Gassaway et al. ....... 267/141.3
4,522,378 A * 6/1985 Nelson .................... 267/141.4
4,783,039 A * 11/1988 Peterson et al. ............ 248/635
4,858,880 A * 8/1989 Durand ....................... 248/635
4,921,203 A * 5/1990 Peterson et al. ............ 248/635
5,110,081 A * 5/1992 Lang, Jr. .................... 248/635
5,115,884 A * 5/1992 Falco ......................... 181/156
5,141,203 A * 8/1992 Baker et al. ................ 248/638

(Continued)

FOREIGN PATENT DOCUMENTS

JP 59219098 A * 12/1984

*Primary Examiner*—Edgardo San Martin
(74) *Attorney, Agent, or Firm*—The Eclipse Group LLP

(57) ABSTRACT

This invention provides a baffle isolation system for isolating a baffle from a housing in a loudspeaker mounting system. The isolation system may include an isolation mechanism that insulates the baffle from the speaker housing. The isolation mechanism may include a bumper member coupled to a hollow shaft. In another embodiment, the bumper member may also include at least two resistant members located on either side of the bumper and coupled to the hollow shaft. These resistant members act to acoustically reduce sound penetration through the isolation system. Radial isolation may be achieved by the bumper acting to reduce the transmission of vibrations from the baffle to the housing, while longitudinal isolation may be achieved by the resistant members. Ideally, the bumper and the resistant members may be manufactured out of an elastomeric material and may be designed as separate members or as one unitary member.

60 Claims, 10 Drawing Sheets

U.S. PATENT DOCUMENTS 5,303,896 A * 4/1994 Sterka ........................ 248/557
5,570,867 A * 11/1996 Norkus ....................... 248/635
5,726,395 A * 3/1998 Anagnos ..................... 181/141
6,173,064 B1 * 1/2001 Anagnos ..................... 381/353
6,354,578 B1 * 3/2002 Nakatsukasa et al. ....... 267/258
6,550,570 B1 * 4/2003 Combest ..................... 181/150
6,561,312 B1 * 5/2003 Stanienda ................... 181/207
6,744,903 B1 * 6/2004 Jeon ........................... 381/388
6,904,157 B1 * 6/2005 Shima ........................ 381/388
2003/0016493 A1 * 1/2003 Hiratomo et al. ........... 361/685

* cited by examiner

LOUDSPEAKER BAFFLE ISOLATION SYSTEM

RELATED APPLICATIONS

This application claims priority to U.S. Provisional Application Ser. No. 60/399,791 filed on Jul. 31, 2002, which is incorporated into this application by reference.

BACKGROUND OF THE INVENTION

1. Field of the Invention

This invention generally relates to the field of loudspeakers. In particular, the invention relates to a system capable of isolating a loudspeaker baffle from a loudspeaker housing.

2. Related Art

Installing a loudspeaker into a surface such as a wall and/or ceiling generally includes cutting an opening into the surface to insert the loudspeaker housing into the opening. The loudspeaker housing may be flush against the surface and have a recessed area to receive a baffle that covers the opening and loudspeaker housing. The baffle may incorporate at least one loudspeaker transducer. The loudspeaker housing may be first secured in the surface and then the baffle (with at least one loudspeaker transducer) may be secured to the loudspeaker housing.

A general problem associated with mounting a loudspeaker to or within a surface is that the mechanical energy created by the operation of the loudspeaker is typically transferred to the surface. This mechanical energy is typically generated by the vibration of the loudspeaker transducer(s) that correspondingly creates vibrations in the loudspeaker housing. The loudspeaker housing typically transfers these vibrations to the surface generating undesirable noise from the movement of the surface.

Prior attempts to solve this problem have included the installation of an isolator between the baffle and the loudspeaker housing to dampen the longitudinal vibration of the loudspeaker during operation. The isolator, however, typically results in misalignment between the baffle and the loudspeaker housing because of the effects of gravity on the weight of the baffle and the loudspeaker(s). This misalignment generally does not allow the isolator to perform properly. Therefore, a need exists for an isolator that isolates the baffle from the loudspeaker housing without misalignment.

Another problem with utilizing isolators relates to differential loading. Differential loading occurs when four isolators are located at each corner of a rectangular shaped loudspeaker housing. Loads in longitudinal and radial directions may be different on the four corners of the loudspeaker housing because the weight of the baffle may not be centered. As an example, the center of mass may be in the lower portion of the baffle resulting in the lower half having greater longitudinal loading than the isolators in the upper half. As a result, utilizing four isolators that are substantially similar in each of the corners may not optimize the performance of the four isolators. Therefore, there is also a need for an isolation system that is capable of adjusting its dampening characters depending on the longitudinal and radial forces applied to the isolators.

SUMMARY

This invention provides a system for isolating a baffle from a housing. The system includes an isolation system having an isolation mechanism that insulates the baffle from the speaker housing. The isolation mechanism comprises a bumper member coupled to a hollow shaft member. The bumper mechanism in its simplest form may be constructed from one piece of an elastomeric material. The bumper may also be grooved to reduce the opportunity for slippage in the mount area between the baffle and the housing. The isolation mechanism may be held in position with end caps located on opposite sides of the hollow shaft member.

In another embodiment, the hollow shaft member may also be capable of accepting and including at least two resistant members. These resistant members, positioned on either side of the bumper, act to acoustically reduce sound penetration through the isolation mechanism. The bumper radially isolates vibration transmission from the baffle, while the resistant members longitudinally isolate the baffle. Ideally, both the bumper and the resistant member may be manufactured out of an elastomeric material and may or may not be made of the same material.

In another embodiment, the invention provides an isolation system between the baffle and the housing having two resistant members that are sculptured to allow the bumper to fit within the resistant members. This isolation system also supports the baffle relative to the housing in both the longitudinal and radial directions. The bumper may also be adapted to insert into an opening within the housing while also being capable of being secured to the baffle. In this embodiment, the assembly's two resistant members may be formed so that each resistant member can encompass at least a portion of the bumper. The baffle is positioned between the two resistant members so that the bumper and resistant members provide a cushion for the baffle.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
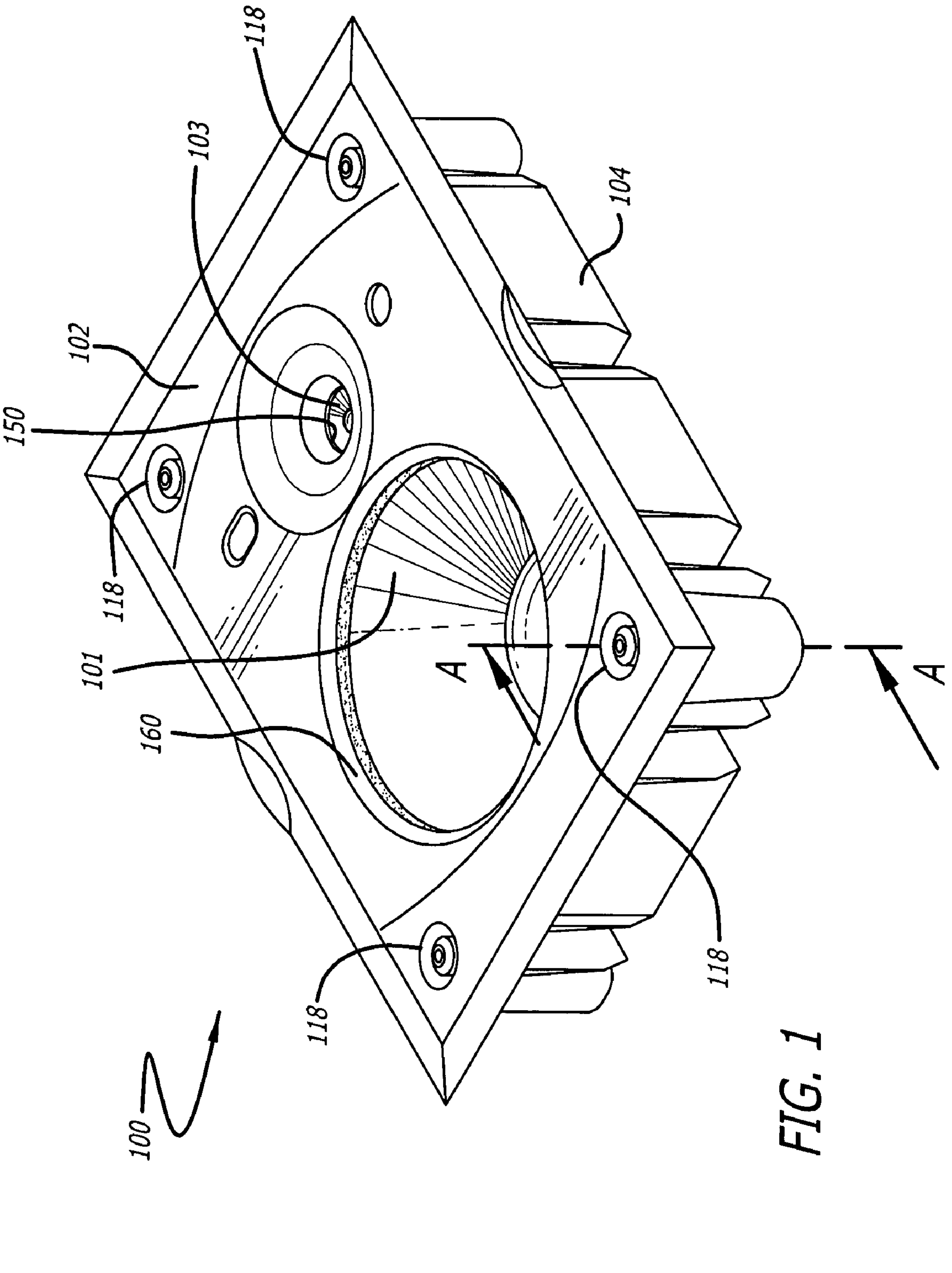
FIG. 1 is a perspective view of a loudspeaker mounting mechanism for mounting a loudspeaker within a surface.

FIG. 1 is a perspective view of a loudspeaker mounting system 100 for mounting at least one loudspeaker 101 within an opening in a surface (not shown), such as a wall or ceiling. As illustrated by FIG. 1, the mounting mechanism 100 includes a housing 104, which may be inserted into an opening formed in a wall or other surface. The loudspeaker housing 104 is generally positioned flush against the surface and includes a baffle 102 that is positioned within a recessed area in the loudspeaker housing 104. The baffle 102 will generally include at least one opening 160 for receiving and incorporating at least one loudspeaker transducer 101. As illustrated, the baffle may also include a second opening 150 for receiving a second loudspeaker transducer 103, such as a tweeter. Furthermore, each baffle 102 may include four isolation openings 118 at each of its corners for securing the baffle 102 to the housing 104 via a baffle isolation system (not shown), as described in further detail below.

Figure 2:
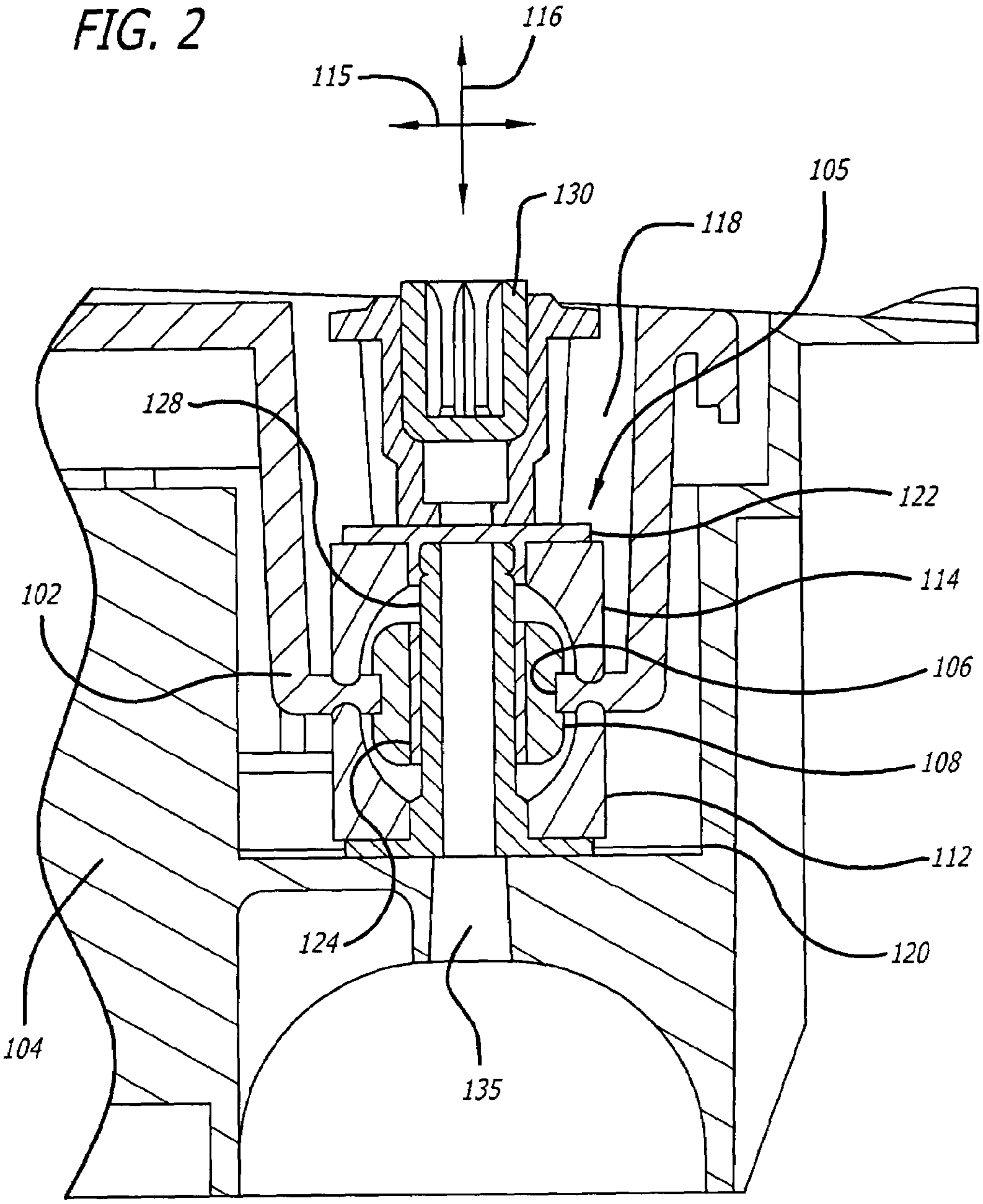
FIG. 2 is a cross-sectional view of the loudspeaker mounting mechanism taken along line A—A of FIG. 1.
Figure 3:
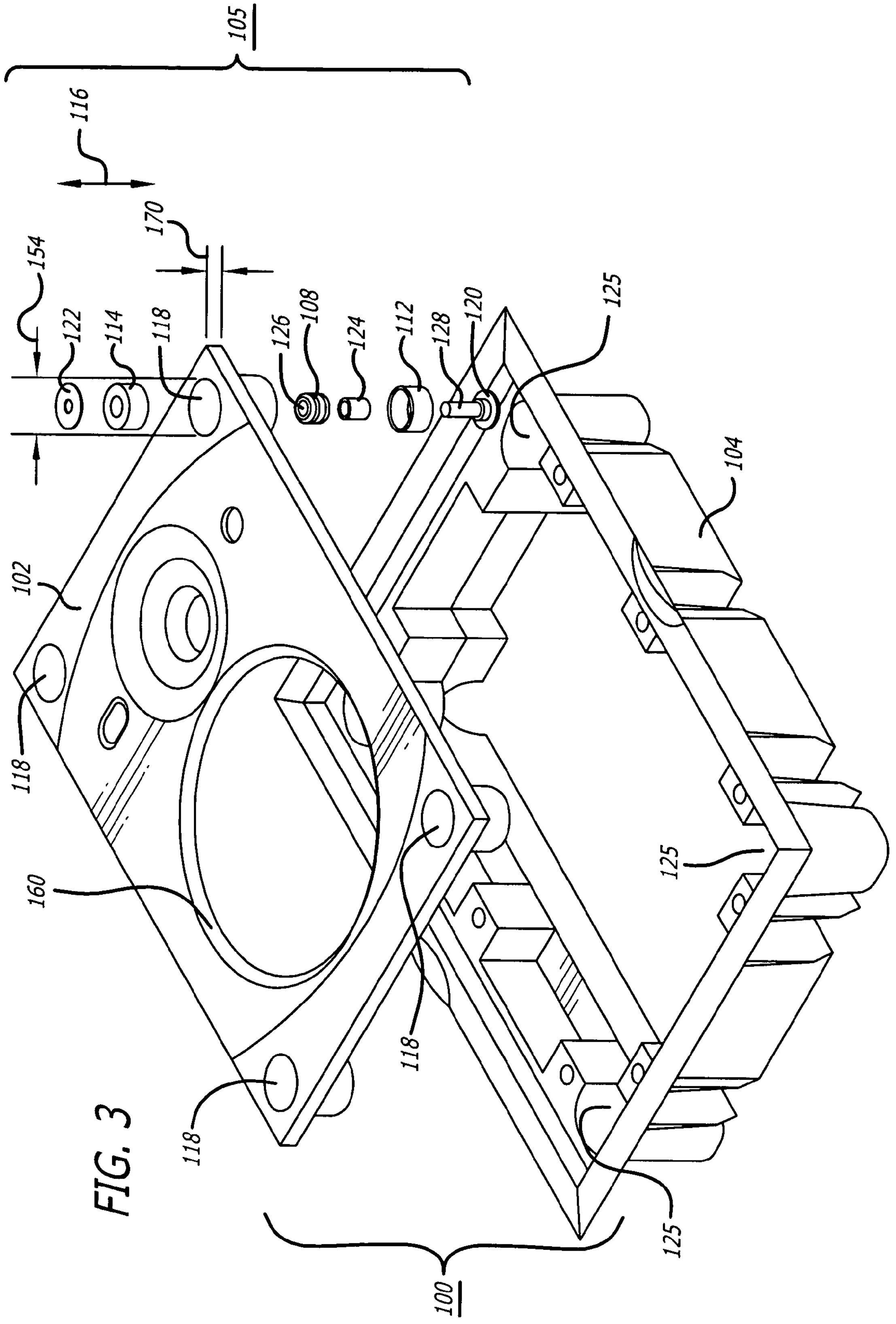
FIG. 3 is an exploded perspective view of the loudspeaker mounting mechanism in FIG. 1.

As illustrated by FIGS. 2 and 3, the loudspeaker mounting system 100 of FIG. 1 further includes a baffle isolation system 105 for isolating the baffle 102 from the housing 104 both in the radial and longitudinal directions. The isolation system 105 may be incorporated between the baffle 102 and the housing 104 to isolate the baffle 102 from the housing 104. Each of the four isolation openings 118 along the four corners of the baffle 102 is adapted to receive a baffle isolation system 105. By placing the isolation system 105 between the baffle 102 and the housing 104, the isolation system 105 helps to prevent vibration generated by the loudspeaker 101 from transferring to the housing 104 and correspondingly to the surface in which the housing 104 is contained.

FIG. 2 is a cross-sectional view taken along line A—A of FIG. 1 illustrating the positioning of the baffle isolation system 105 assembled in one corner of the loudspeaker mounting mechanism 100. As illustrated in FIG. 2, each isolation opening 118 of the baffle isolation system 105 aligns with a corresponding recessed opening 125 (FIG. 3) located in the housing 104. The baffle isolation system 105 is then positioned in the isolation opening 118 of the baffle 102 such that it extends between the isolation opening 118 of the baffle 102 and the recessed opening 125 of the housing 104.

Each of the isolation openings 118 includes a baffle opening 106 for receiving a bumper 108. The bumper 108 may include a groove or cavity 110 (FIG. 4) formed along the circumference of the bumper 108 that is designed to fit securely within the baffle opening 106 to substantially isolate the baffle 102 in the radial direction 115 relative to the housing 104. Resistant members 112 and 114 are the placed on each side of the bumper 108 to isolate the baffle 102 in the radial direction 115 relative to the housing 104. A first resistant member 112 is placed below the bumper 108 in the cavity of the corresponding recessed opening 125 in the housing 104. A second resistant member 114 is placed above the bumper 108 in the cavity formed by the isolation recessed opening 118 in the baffle 102. A first end cap 120 is placed just below the first resistant member 112 and a second end cap 122 is placed just above the second resistant member 114. A hollow shaft 128 runs through the baffle isolation system 105 from the first end cap 120 to the second end cap 122. The hollow shaft 128 is secured at both its distal ends to the first end cap 120 and second end cap 122 respectively, thereby containing the isolation system 105 between the first and second end caps 120 and 122 respectively. A hollow sleeve 124 may further be positioned within an opening 126 (FIG. 3) in the bumper 108.

The diameter of an isolation opening 118 in the baffle 102 and the recessed opening 125 in the housing 104 may be greater than that of the resistant members 112 and 114 so that the baffle may move both in the radial 115 and the longitudinal 116 directions without causing the baffle 102 to touch resistant member 114 or cause the housing 104 to contact the resistant member 112. This may allow the isolation system 105 to substantially isolate the baffle 102 from the housing 104 in both the radial 115 and longitudinal 116 directions.

As illustrated in FIG. 2, a third end cap 130 may be aligned just above the second end cap 122. The first, second and third end caps 120, 122 and 130 may all include a central bore of substantially the same size for receiving a pin or other securing mechanism for fastening or securing the isolation system 105 to the housing 104 and the baffle 102. For example, a screw (not shown) may then be inserted through the central bore in the third end cap 130, second end cap 122, the hollow shaft 124 and the first end cap 120 of the isolating system 105 and into an opening 135 in the housing 104 for receiving the screw.

FIG. 3 is an exploded view of the loudspeaker mounting system 100 illustrated in FIG. 1. While the isolation system 105 may be used in each corner of the baffle 102 or in other alternative positions about the baffle 102, for illustrative purposes, FIG. 3 only depicts the baffle isolation system 105 in the top right corner of the mounting system 100.

FIG. 3 shows the assembly of the baffle isolation system 105 between the baffle 102 and the housing 104. The bumper 108 is inserted into the baffle opening 106 (FIG. 2) so that the cavity 110 (FIG. 4) may be flush against the baffle opening 106. Once the bumper 108 is in place, a hollow sleeve 124 may be inserted through the bumper opening 126 until both ends of the sleeve 124 are flush against the bumper 108. Then, first and second resistant members 112 and 114 may be placed against the baffle 102, one on each side of the baffle 102. The hollow shaft 128 of the first cap 120 may be then inserted through an opening in the first resistant member 112, the sleeve 132 and the second resistant member 114 and coupled to the second end cap 122 to hold the system 100 in place.

As previously discussed, the diameter 154 of the isolation opening 118 may be greater than that of the resistant members 112 and 114 such that the baffle 102 may move both in the radial 115 and the longitudinal 116 direction without causing the baffle 102 to touch resistant member 114 or cause the housing 104 to contact the resistant member 112. And, with the first cap 120 or the second cap 122 coupled to the housing 104, the isolation system 100 may substantially isolate the baffle 102 from the housing 104 in all directions.

Figure 4:
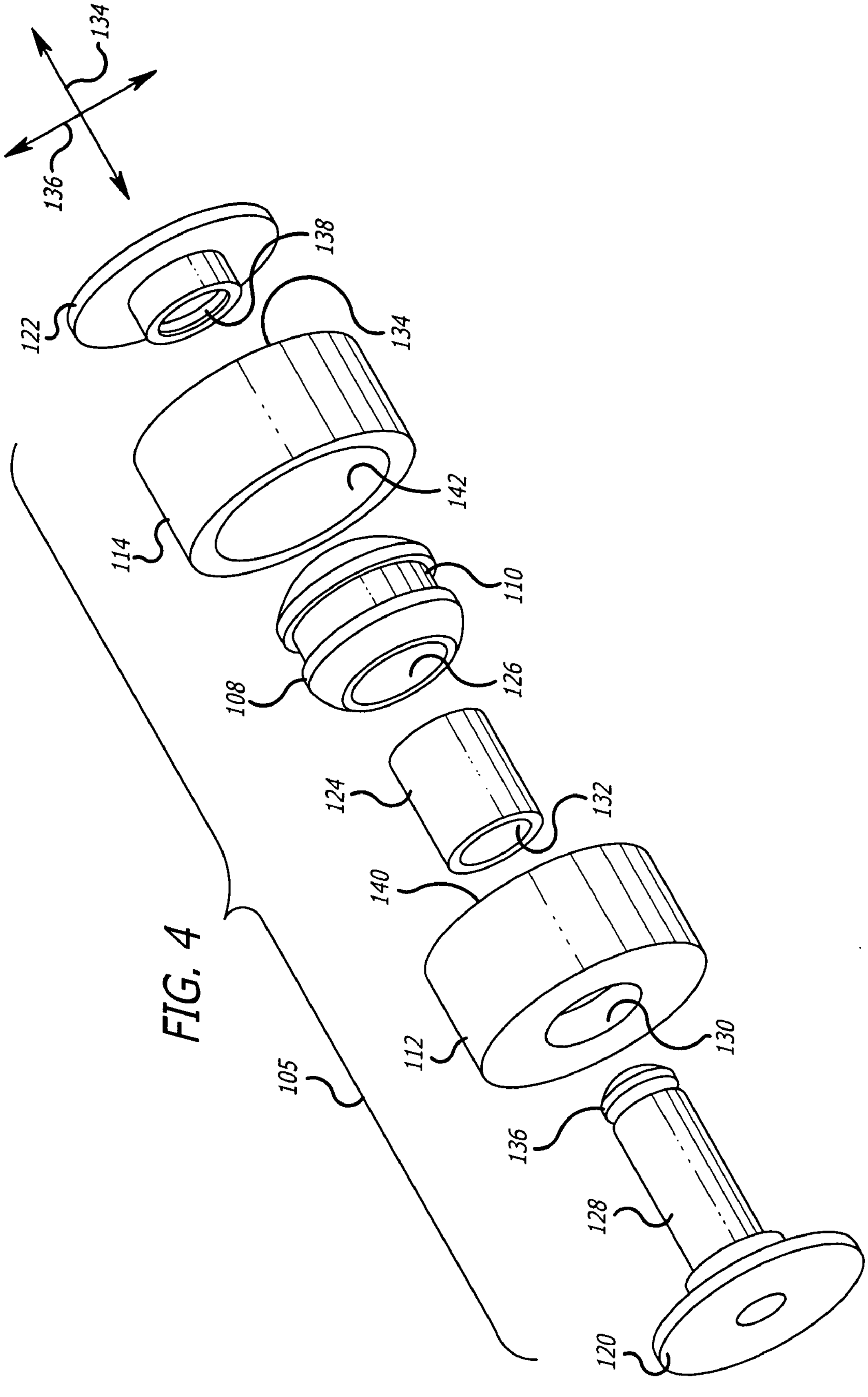
FIG. 4 is an unassembled detailed perspective view of each member of the isolation system illustrated in FIG. 3.

FIG. 4 is an unassembled detailed perspective view of each member of the isolation system 105. As illustrated in FIG. 4, the bumper 108 may include a groove or cavity 110 formed along the circumference of the bumper 108 that is designed to fit securely within the baffle opening 106 (FIG. 2). Placing the bumper 108 in the baffle opening 106 assists with isolating the baffle 102 in the radial direction 115 relative to the housing 104.

The bumper 108 may further include an opening 126 for receiving a hollow sleeve 124. The sleeve 124 may be sized to fit within the bumper opening 126 and may have a longitudinal length that may be substantially equal to the longitudinal length of the bumper 108. This may allow the two ends of the sleeve 124 to be substantially flush against the opposing ends of the bumper 108 when positioned with the bumper opening 126. Once the sleeve 124 is inserted into the bumper opening 126, the outer surface of the sleeve 124 may resist against the inner surface of the bumper opening 126 so that the sleeve 124 may not easily fall out. The sleeve 124, however, may be later removed from the bumper opening 126 if desired. The sleeve 124 may be made of a material that provides minimal resistance with the hollow shaft 128 so that there may be low friction between the two. The sleeve 124 may be made of such material as Teflon®, nylon, or Delrin®.

The first resistant member 112 may have a first resistant member opening 130 and a first resistant member bore 140. The second resistant member 114 may have a second resistant member opening 134 and a second resistant member bore 142. The first and second central bores 140 and 142 may be contoured so that at least a portion of the bumper 108 may be between the two bores 140 and 142. The contour of the first and second bores 140 and 142 may be varied or adjusted to provide a predetermined damping characteristic. For example, a larger bore means that the respective sidewalls of the resistant members 112 and 114 may be thinner so that the sidewalls may provide less resistance to the longitudinal loads. The bores 140 and 142 of the respective sidewalls of the resistant members 112 and 114 may also be contoured to provide a "soft bottoming" as the two resistant members 112 and 114 reach their excursion limit in the longitudinal direction 134. At least a portion of the bumper 108 may be disposed within the bores 140 and 142 and may have a sufficient space between the two bores 104 and 142 to allow the bumper 108 to move freely, both along the longitudinal axis or direction 134 and along the radial axis or direction 136.

The first cap 120 and a second cap 122 may be placed on the two opposite ends of the isolation system 105 and may be adapted to couple to each other via a hollow shaft 128 to hold the isolation system 105 together. The first or second cap 120 or 122 may have a hollow shaft 128 extending from the interior side of cap 120 or 122. In the example embodiment illustrated in FIG. 4, the hollow shaft 128 extends from the first cap 120 and may be then inserted through the first resistant member opening 130, the sleeve opening 132, and the second resistant member opening 134, respectively. The distal end 136 of the hollow shaft 128 may then be coupled to a second cap recess 138 located on the interior side of the second end cap 122 to hold the system 100 in place.

To couple the hollow shaft 128 to the second cap recess 138, the hollow shaft 128 may have a distal end 136 adapted to be releasable or fixedly coupled to the second cap recess 138 within the second end cap 122. The hollow shaft 128 may have sufficient length to allow the distal end 136 to couple to the second end cap 122 when the isolation system 105 is assembled.

The performance of the isolation system 105 may be modified by using a bumper 108 and resistant members 112 and 114 made from a material having a different durometer relative to one another. The bumper 108 and the two resistant members 112 and 114 may be made out of an elastomeric material having certain softness selected from a predetermined range of durometer hardness. Durometer may be a measurement of a material's hardness. Depending on the load on each of the pieces in the isolation system 105, the bumper 108 and each of the resistant members 112 and 114 may be designed to have different durometers. For example, the bumper 108 may be made of material having greater durometer than that of the two resistant members 112 and 114 because the radial load on the bumper 108 may be greater than the lateral or longitudinal load on the two resistant members 112 and 114. The second resistant member 114 may be designed to have a greater durometer than first resistant member 112 because the forward longitudinal load on the second resistant member 114 may be greater than the back longitudinal load on the first resistant member 112. Both the bumper 108 and the resistant members 112 and 114 may have a durometer of about 20 to about 100. The bumper 108 and resistant members 112 and 114 may be made from an elastomeric material, such a sorbothane, or other materials known to one skilled in the art.

In addition to the durometer of the members of an individual isolation system varying, each isolation system 105 in any given loudspeaker mounting system 100 may be made of materials having different durometers depending upon the particular load on the isolation system 105 at its position in the loudspeaker mounting system 100. For example, more longitudinal load will be placed on the isolation systems 105 that are closer in proximity to a low-frequency transducer 101 (FIG. 1) mounted in the bass opening 160 (FIG. 1). The closer the isolation system 105 to the low-frequency transducer 101, the more back and forth motion of the low-frequency transducer 101 the isolation system 105 will absorb, thereby putting more longitudinal load on those isolation systems 105 closer in proximity to the low-frequency transducer 101. To handle to the additional load, the resistant members 112 and 114 in isolation systems 105 in close proximity to the low-frequency transducer 101 may be made of material having a higher durometer than the resistant members 112 and 114 in the isolation systems 105 more distal from the low-frequency transducer 101.

Figure 5:
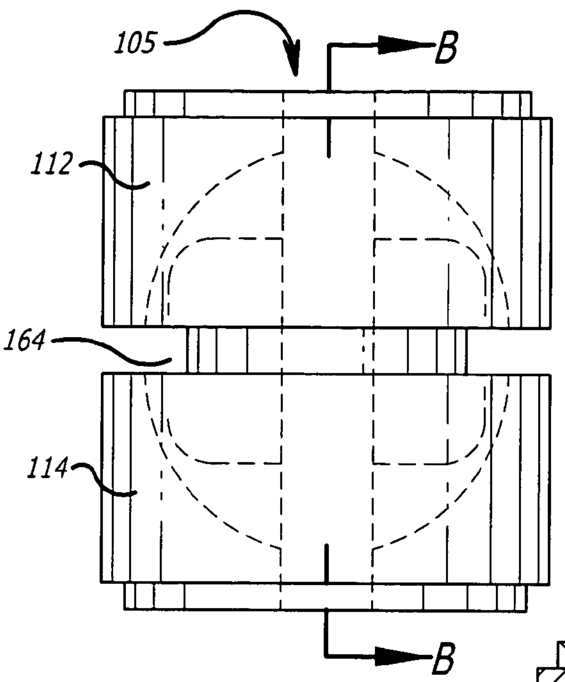
FIG. 5 illustrates the members of the baffle isolation system of FIG. 4 as they would appear assembled.

FIG. 5 illustrates a side view of the members of the baffle isolation system 105 of FIG. 4 as they would appear assembled. As illustrated in FIG. 5, a gap 164 may be formed between the first and the second resistant members 112 and 114. The thickness of the gap 164 may be substantially similar to a wall thickness 170 (FIG. 3) of the baffle 102 so that the baffle opening 106 (FIG. 2) may be positioned between the first and second resistant members 112 and 114. Accordingly, as the baffle 102 moves back and forth along the longitudinal direction, the two resistant members 112 and 114 may substantially isolate the baffle from the housing 104.

Figure 6:
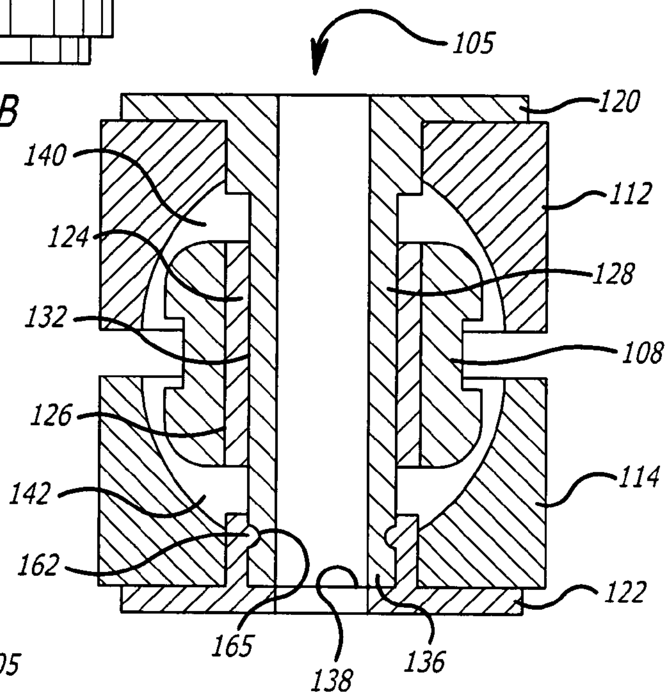
FIG. 6 is a cross-section view of the assembled baffle isolation system taken along line B—B of FIG. 5.

FIG. 6 is a cross-section view of the baffle isolation system 105 taken along line B—B of FIG. 5. Central to the isolation system 105 is the bumper 108, having a first resistant member 112 positioned directly below the bumper 108 and a second resistant member 114 positioned above the bumper 108. End caps 120 and 122 are positioned at both ends of the assembly, one end cap 120 may have a hollow shaft 128 from the interior side of the end cap 120 through a central bore in the assembly to couple to the opposing end caps 120 and 122 to one another and to hold the members of the isolation system 105 together.

The sleeve 124 may be firmly held in place within the bumper opening 126 (FIG. 4). The outer diameter of the hollow shaft 128 may be slightly less than the inner diameter of the sleeve opening 132 so that the hollow shaft 128 may freely slide within the sleeve opening 132. At least a portion of the bumper 108 may be within the two central bores 140 and 142, so that the bumper 108 may freely slide both radially and longitudinally without touching the first and second resistant members 112 and 114. To engage the first cap 120 to the second cap 122, the distal end 136 of the hollow shaft 128 may have a recess 165 adapted to engage with a tooth 162 formed within the second cap recess 138. Accordingly, the two caps 120 and 122 may hold the isolation system 105 together. Alternatively, threads may be used between the distal end 136 and the second cap recess 138 to couple the two ends together. Any other methods known to one skilled in the art may also be used to releasably or fixedly couple the distal end 136 to the second cap recess 138. While it may be more desirable to have the assembly releasably coupled, the members of the isolation system 105 may be more permanently affixed to one another by adhesives or other more permanent methods for affixing the members of the isolation system 105 to one another.

Figure 7:
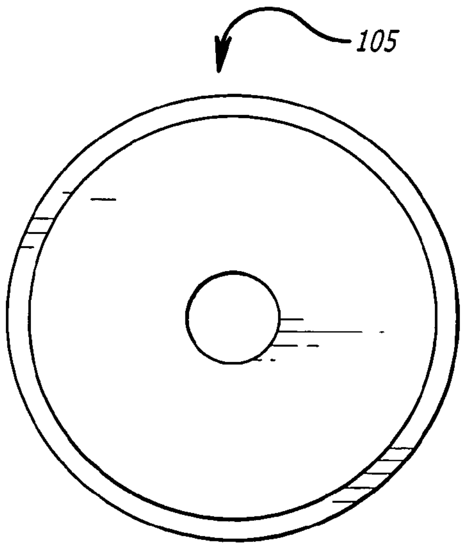
FIG. 7 is a plan view of the assembled baffle isolation system illustrated in FIG. 5.

FIG. 7 is a plan view of the assembled baffle isolation system 105 illustrated in FIG. 5. In this illustration, the shape of the isolation system 105 is shown as having a circular shape. The shape of the isolation system 105, however, may have a variety of shapes, such as rectangular, triangular, oval, octagonal, or square shaped. Accordingly, the shape of the isolation system 105 is not limited to the circular assembly illustrated. Furthermore, in this illustration, the central bore of the assembly may be easily seen. The central bore may accept a screw or other similar mounting mechanism for securing the baffle isolation system 105 to the housing 104 and baffle 102.

Figure 8:
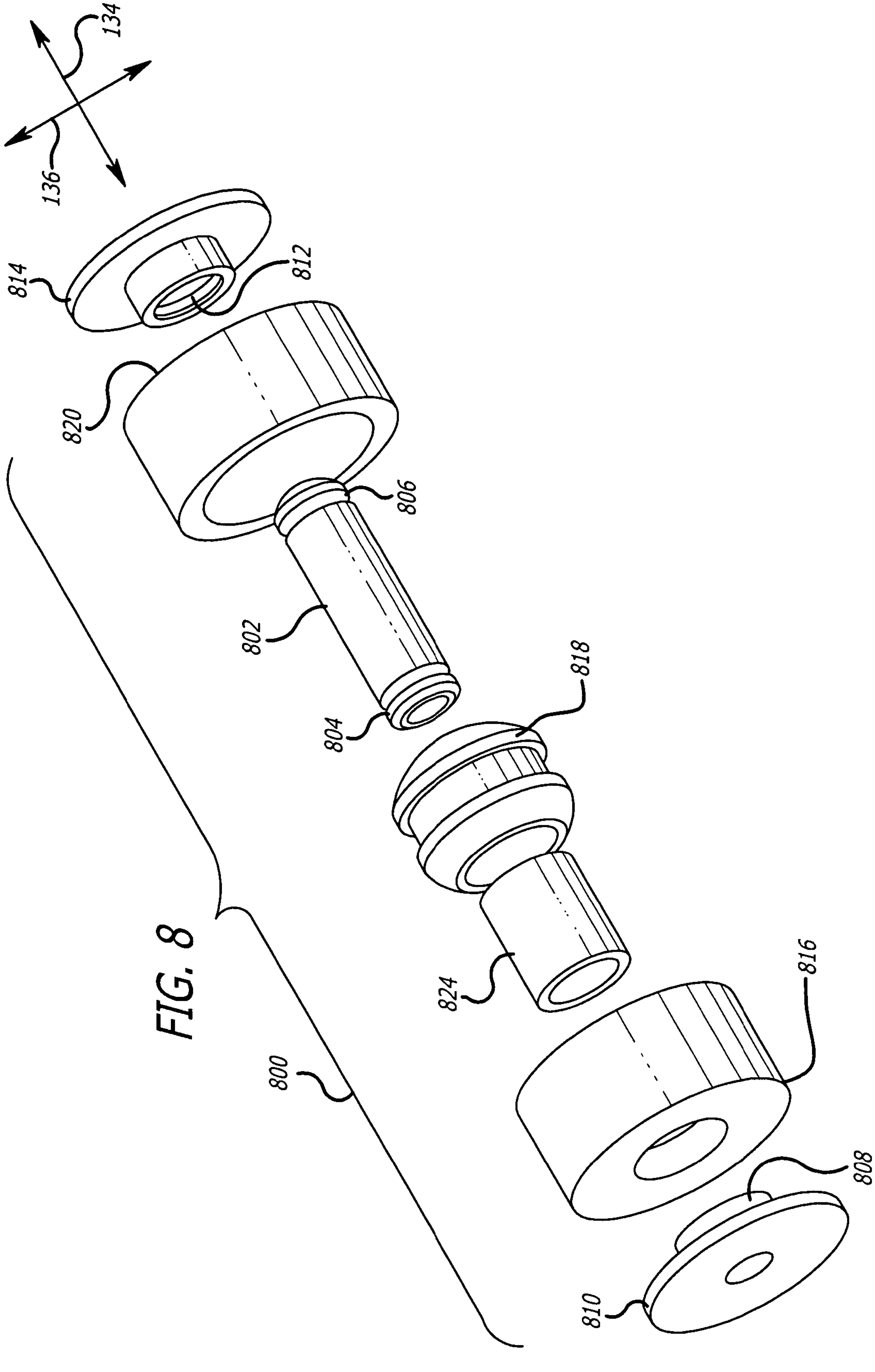
FIG. 8 is an unassembled detailed perspective view of each member of an alternative embodiment of a baffle isolation system.

FIG. 8 illustrates another exemplary embodiment of a baffle isolation system 800. While FIGS. 2–7 depict the hollow shaft 802 as being integrated into one of the end caps 810 or 814, as illustrated by FIG. 8, the hollow shaft 802 may be a designed as a separate piece from that of the first or second end caps 810 or 814. In the example embodiment, the bumper 818, first and second resistant members 816 and 820 and the sleeve 824 may be similar in design and function to the corresponding parts illustrated in FIGS. 2–7 above. The first end cap 810 is adapted to couple to one distal end 804 of the hollow shaft 802 via a first cap recess 808 formed on the interior side of the first end cap 810. Similarly, the second end cap 814 may have a second cap recess 812 for receiving a second distal end 806 of the hollow shaft 802. The hollow shaft 802 may be sized to fit through the central openings of the first resistant member 816, sleeve 824, bumper 818 and second resistant member 820. The hollow shaft 802 may have a longitudinal length to allow the first and second distal ends of the shaft 802 to couple to the first and second cap recesses 808 and 812, respectively, when the isolation system 800 is assembled.

The hollow shaft 802 may be designed to freely slide within the openings of the first resistant member 816, the sleeve 824, and the second resistant member 820. Alternatively, the hollow shaft 802, the first end cap 810, and the second cap 814 may be made of a low friction material such as Teflon®, nylon, Delrin®, or any other suitable material substantially similar to the sleeve 824 so that once the isolation system 800 is assembled, it may be firmly held in place.

Figure 9:
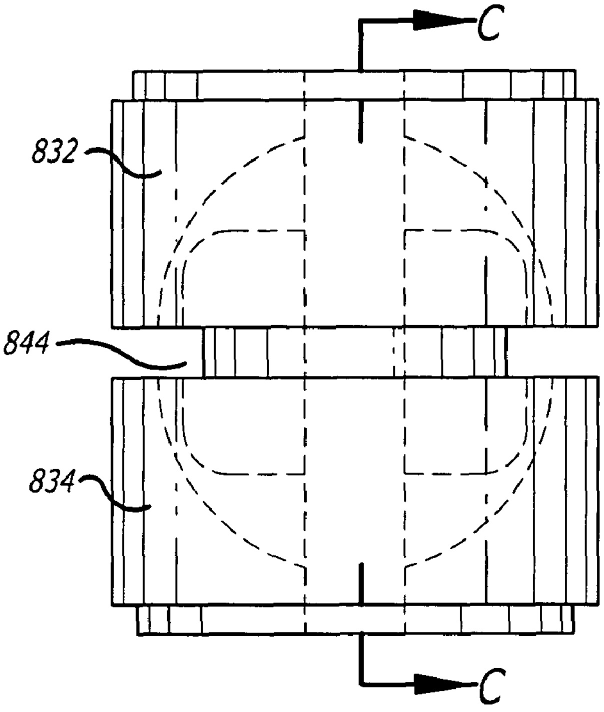
FIG. 9 illustrates the members of the baffle isolation system of FIG. 8 as they would appear assembled.

FIG. 9 illustrates a side view of the members of the baffle isolation system of FIG. 8 as they would appear assembled. Similar to the isolation system 105 depicted in FIGS. 2–7, the assembled isolation system 800 may have a gap 844 formed between the first and the second resistant members 832 and 834. The thickness of the gap 844 may be substantially similar to the wall thickness 170 (FIG. 3) of the baffle 102 such that the baffle opening 106 (FIG. 2) may be positioned between the first and second resistant members 832 and 834.

Figure 10:
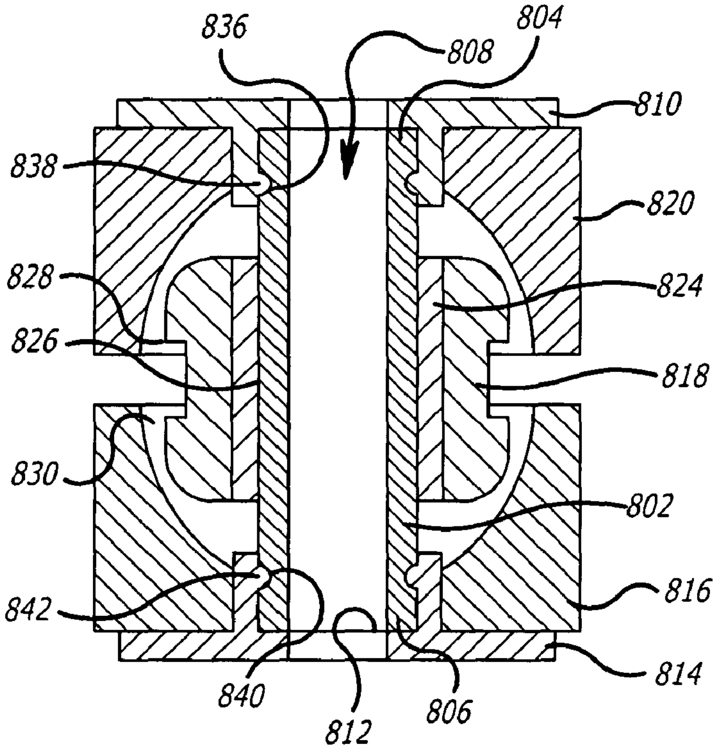
FIG. 10 is a cross-section view of the assembled isolation system taken along line C—C of FIG. 8.

FIG. 10 illustrates a cross-sectional view of the assembled isolation system 800 of FIG. 8. Central to the isolation system 800 is the bumper 818, having a first resistant member 816 positioned directly below the bumper 818 and a second resistant member 820 positioned above the bumper 108. End caps 810 and 814 are positioned at both ends of the assembly. In this embodiment, both end caps 810 and 814 have a cap recess 812 and 808 for receiving the distal ends 804 and 806 of the hollow shaft 802. The sleeve 824 may be firmly held in place within the central opening of the bumper 818. The outer diameter of the hollow shaft 802 may be slightly less than the inner diameter of the sleeve opening 826 so that the hollow shaft 802 may freely slide within the opening of the sleeve 824. At least a portion of the bumper 818 may be within the two central bores 828 and 830 of the resistant members 820 and 816 so that the bumper 818 may freely slide both radially and longitudinally without touching the first and second resistant members 820 and 816.

The first end 804 of the hollow shaft 802 may have a first hollow shaft recess 836 adapted to engage a first cap tooth 838 formed within the first cap recess 808. The second end 806 of the hollow shaft 802 may also have a second hollow shaft recess 840 adapted to engage a tooth 842 formed within the second cap recess 812. Accordingly, the two end caps 810 and 814 may hold the isolation system 800 together. Alternatively, adhesive may be used between the first end 804 of the hollow shaft 802 and the first cap recess 808 to couple the two ends together. Moreover, adhesive may be used between the second end 806 of the hollow shaft 802 and the second cap recess 812. Any other method known to one skilled in the art may be used to releasably or fixedly couple the first and second ends 804 and 806 of the hollow shaft 802 to the first and second cap recesses 808 and 812, respectively.

Figure 11:
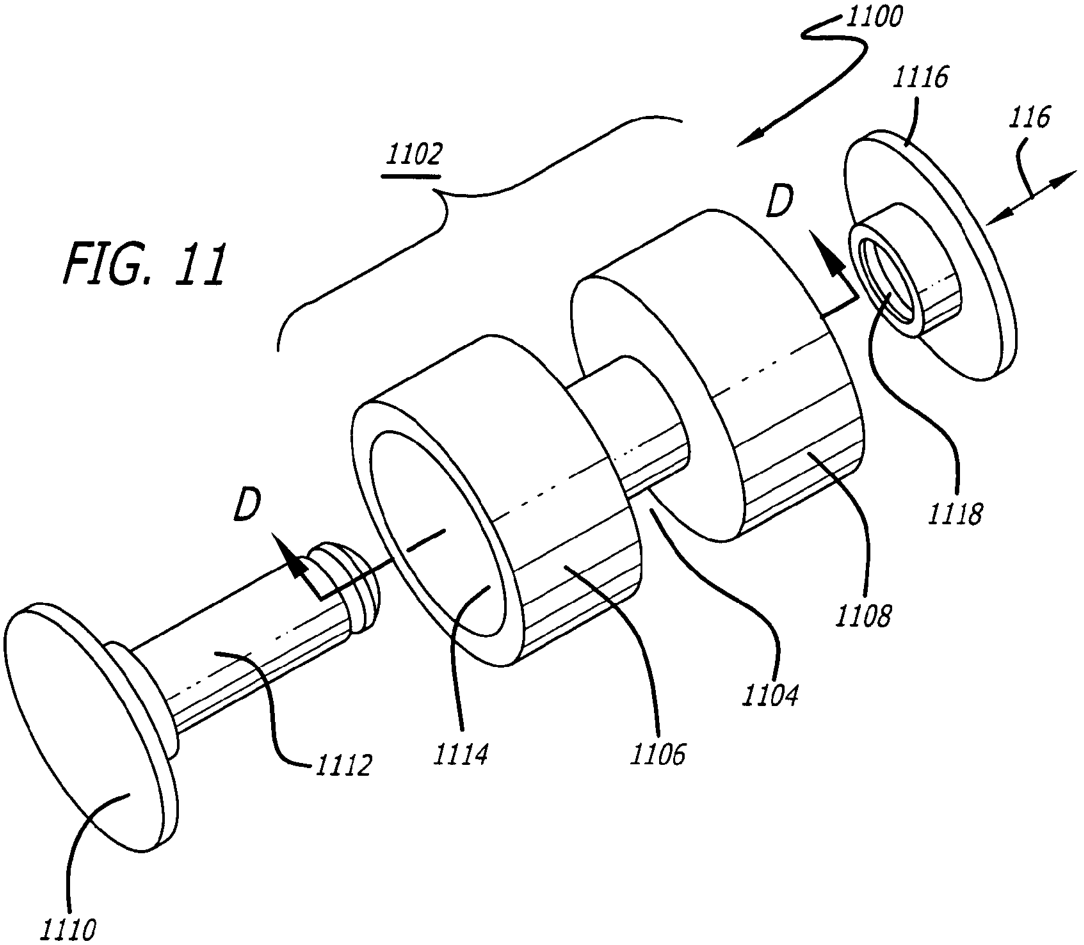
FIG. 11 is an unassembled detailed perspective view of each member of an alternative embodiment of a baffle isolation system having a unitary baffle isolation member.

FIG. 11 illustrates another embodiment of a baffle isolation system 1100 having a unitary isolation member 1102 that includes a bumper portion 1104 between a first resistant portion 1106 and a second resistant portion 1108. The isolation system 1100 may be installed by inserting the unitary isolation member 1102 into the baffle opening 106 (FIG. 2). A hollow shaft member 1112 connected to a first end cap 1110 may be inserted into an opening 1114 extending through the unitary isolation member 1102. The end of the hollow shaft 1112 may be coupled to a recess opening 1118 formed in an opposing second cap 1116 to assemble the isolation system 1100. The first cap 1110 or the second cap 1116 may be coupled to the housing 104 so that as the baffle 102 moves relative to the housing 104, the isolation system 1100 may isolate the baffle 102 from the housing 104. As before, the hollow shaft member 1112 may formed as part of the end cap 1110 or may be separate from the end cap 1110. The opposing distal ends of the hollow shaft member 1112 may be secured against the end caps 1110 and 1116 via a friction fit, or other means for releasably coupling the hollow shaft 1112 to the end caps 1110 and 1116, or may be more permanently affixed to the end caps 1110 and 1116 via adhesive or other similar means.

Figure 12:
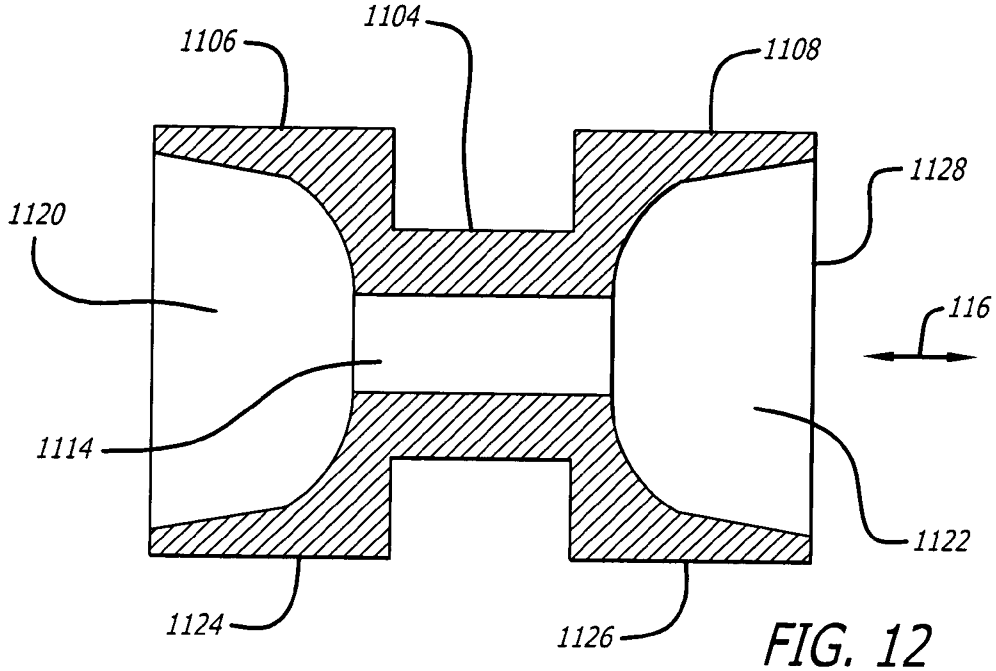
FIG. 12 is a cross-section view of the unitary isolation member taken along line D—D of FIG. 11.

FIG. 12 is a cross-section view of the unitary isolation member taken along line D—D of FIG. 11. As illustrated by the cross-section of FIG. 12, the bumper 1104 may have a smaller circumference than the two resistant members 1106 and 1108 so that the bumper 1104 may fit into the baffle opening 106. Once the bumper 1104 is inserted into the baffle opening 106 (FIG. 2), the baffle may snugly fit between the two resistant members 1106 and 1108. The bumper 1104 may isolate most of the radial load between the baffle 102 and the housing 104. The resistant members 1106 and 1108 may isolate most of the longitudinal loads.

The two cavities 1120 and 1122 may form sidewalls 1124 and 1126 where the thickness of the two sidewalls 1124 and 1126 may vary along the longitudinal direction 116. For example, the thickness of the sidewalls 1124 an 1126 may increase from the lip 1128 of the resistant member 1108 to the bumper 1104. With the thinner sidewall 1126 near the lip 1128, the initial resistance from the resistant member 1108 may be nominal, but as the baffle 102 places additional longitudinal load on the resistant member 1108, its resistance may increase because of the thicker sidewalls 1124 and 1126. This way, the isolation mechanism 1102 may be made of a material having desirable hardness and configured to resist the longitudinal load to improve the isolation of the baffle 102 from the housing 104.

Figure 13:
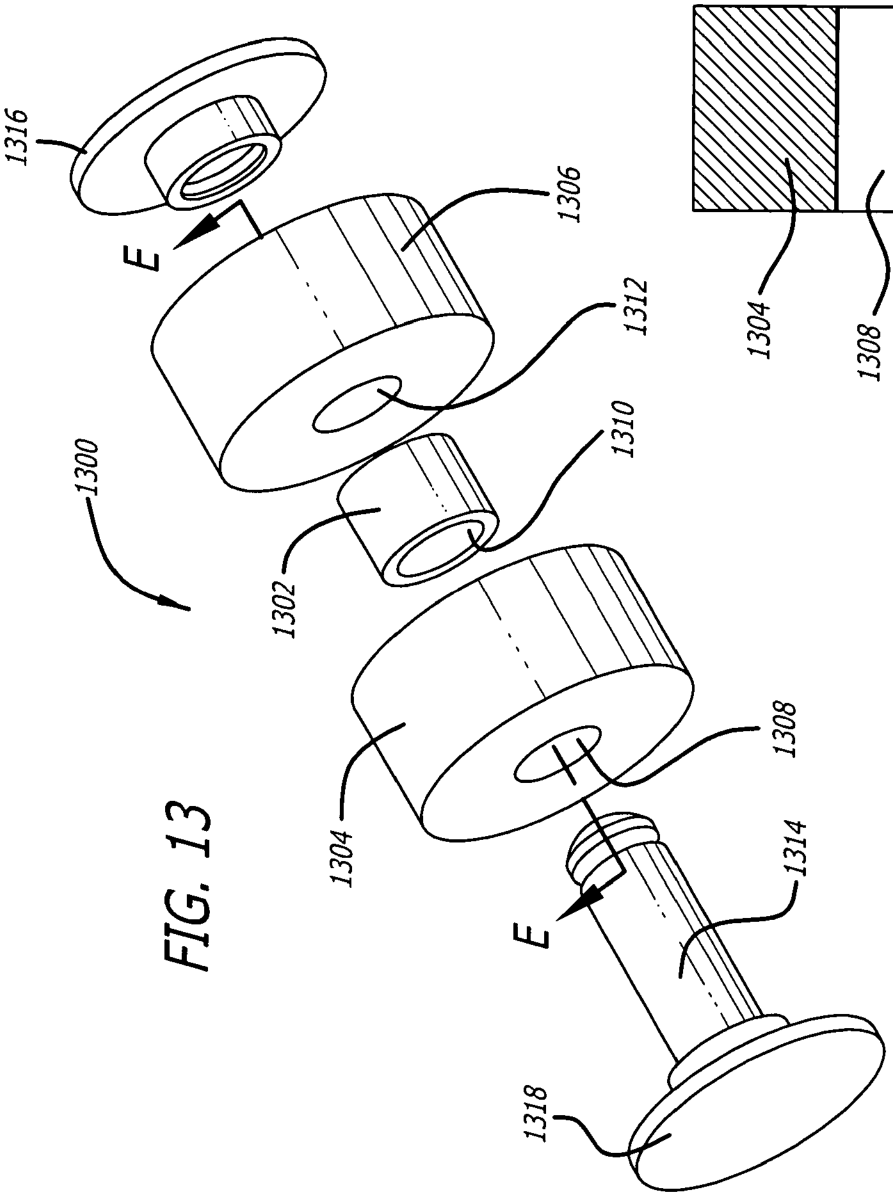
FIG. 13 is an unassembled detailed perspective view of each member of another embodiment of a baffle isolation system.

FIG. 13 is an unassembled detailed perspective view of each member of another embodiment of a baffle isolation system 1300. In this embodiment, the bumper 1302 and the two resistant members 1304 and 1306 of the isolation system 1300 may all have openings 1308, 1310, and 1312 of constant diameters along their length. These openings 1308, 1310 and 1312 are adapted to receive a hollow shaft 1314 extending from or coupled to a first end cap 1318. At its distal end, the hollow shaft 1314 couples to a second cap end 1316. In operation, the isolation system 1300 of this embodiment, may be installed into the baffle 102 by inserting the bumper 1302 into the baffle opening 106 (FIG. 2) and positioning the first and second resistant members 1304 and 1306 on each side of the baffle 102. The hollow shaft 1314 may then be inserted through the openings 1308, 1310, and 1312. To assemble the isolation system 1300, the distal end of the hollow shaft 1314 may be coupled to the second cap 1316.

Figure 14:
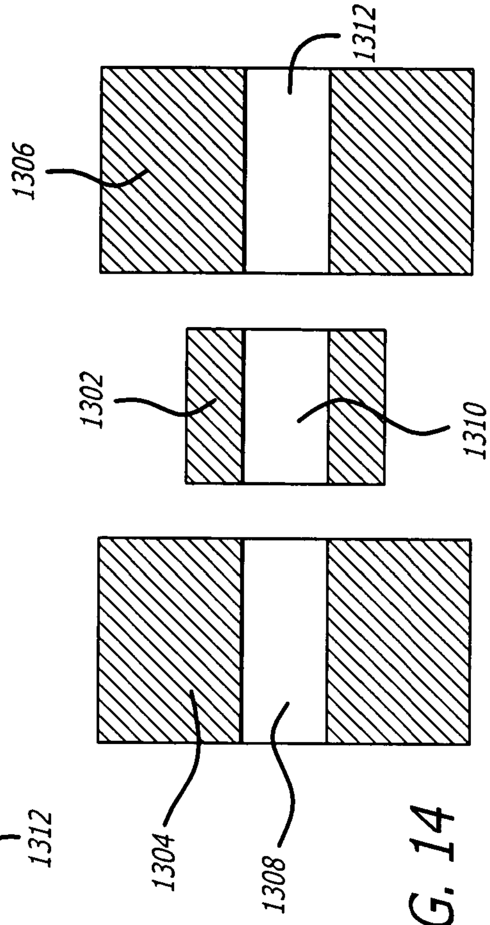
FIG. 14 is a cross-section view of the baffle and resistant members of the isolation system taken along line E—E of FIG. 13.

FIG. 14 is a cross-section view of the baffle and resistant members of the isolation system taken along line E—E of FIG. 13. As illustrated by FIG. 14, the openings 1308, 1310 and 1312 of the bumper 1302 and the two resistant members 1304 and 1306, respectively, are of a constant diameter along their length.

Figure 15:
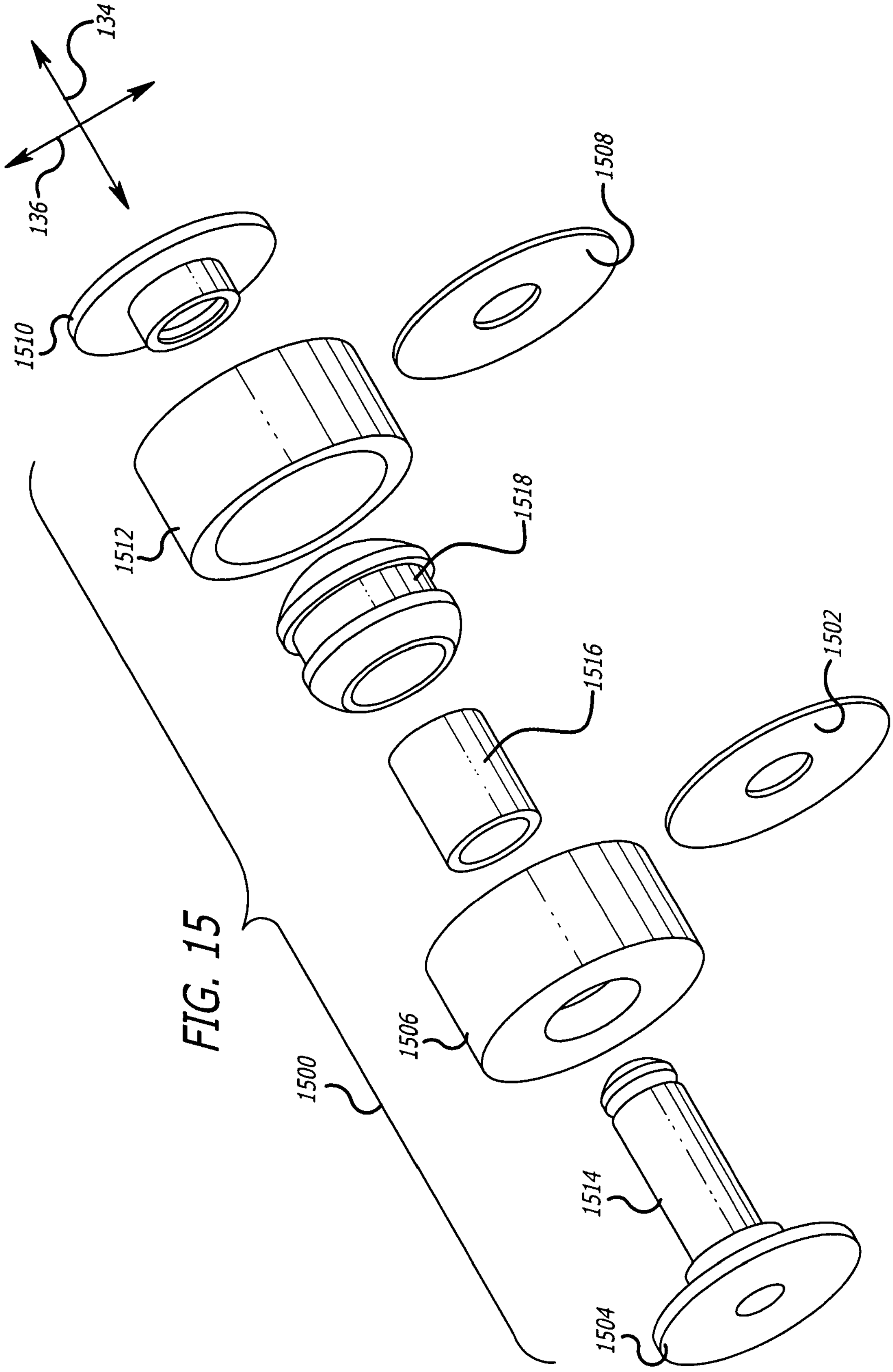
FIG. 15 is an unassembled detailed perspective view of each member of an alternative embodiment of a baffle isolation system incorporating washers to adjust the length of the isolation system.

FIG. 15 illustrates an isolation system 1500 further including a first washer 1502 and a second washer 1508 that may be used for adjusting to the length of the isolation system 1500. The first washer 1502 may be placed between the first cap 1504 and the first resistant member 1506, and the second washer 508 may be between the second cap 1510 and the second resistant member 1512. The number of washers 1502 and 1508 added to the isolation system 1500 may vary to adjust for the longitudinal length of the hollow shaft 1514 and the longitudinal length of the hollow shaft 1514 due to added thickness of the washers 1502 and 1508. The design of the sleeve 1516 and bumper 1518 may be similar to those depicted in earlier embodiments. While the use of washers 1502 and 1508 to adjust for length is illustrated in connection with only one embodiment, washers 1502 and 1508 may be used to increase the length of the isolation system 105 in a variety of embodiments, such as those earlier described, as well as other isolation system designs within the scope of the invention.

In general, the isolation between the baffle 102 and the housing 104 may also generally be improved by providing a gasket (not shown) between the baffle 102 and the housing 104 (FIGS. 1–3). The gasket may be made out of an elastomeric material substantially similar to the bumper 108 and the resistant members 112 and 114. The durometer of the gasket may be adjusted to improve the isolation of the baffle 102 from the housing 104. The gasket may have sufficient flexibility and softness to absorb the energy transmitted from the speaker incorporated into the baffle 102 as it vibrates back and forth. The gasket may also have a variety of shapes to minimize atmospheric air from entering the housing 104 once the baffle 102 encloses the housing 104.

While various embodiments of the invention have been described, it will be apparent to those of ordinary skill in the art that many more embodiments and implementations are possible within the scope of this invention. Accordingly, the invention is not to be restricted except in light of the attached claims and their equivalents.

What is claimed is:

1. A loudspeaker baffle isolation assembly comprising:

a loudspeaker baffle including a baffle portion defining a baffle opening, the baffle portion including a first surface and a second surface;

a bumper positioned in the baffle opening and contacting the baffle portion, the bumper including a first side and a second side;

a first resistant member generally disposed on the first side of the bumper and contacting the first surface of the baffle, the first resistant member having a first bore, where at least a portion of the bumper on the first side extends into the first bore and is coaxial with the first bore relative to a longitudinal axis, and the bumper is separate from and spaced from the first resistant member; and a second resistant member generally disposed on the second side of the bumper and contacting the second surface of the baffle, the second resistant member having a second bore, where at least a portion of the bumper on the second side extends into the second bore and is coaxial with the second bore relative to the longitudinal axis, and the bumper is separate from and spaced from the second resistant member.

2. The assembly of claim 1, further including a loudspeaker housing, where the first resistant member is interposed between the first surface of the baffle and the housing.

3. The assembly of claim 2, further including a loudspeaker disposed in the loudspeaker housing.

4. The assembly of claim 1, where the bumper has a bumper opening formed through the bumper from the first side to the second side, the first resistant member has a first resistant member opening, the second resistant member has a second resistant member opening, and the assembly further includes a shaft extending along the longitudinal axis from the first resistant member opening, through the bumper opening and into the second resistant member opening.

5. The assembly of claim 4, further including a loudspeaker housing having a housing opening, where the first resistant member is interposed between the first surface of the baffle and the housing opening, and where the bumper opening, the first resistant member opening, the second resistant member opening, and the housing opening are aligned with each other relative to the longitudinal axis.

6. The assembly of claim 5, where the shaft is hollow.

7. The assembly of claim 4, where the shaft has an outer diameter, the bumper opening has an inner diameter, and the outer diameter is less than the inner diameter such that the shaft is slidable within the bumper opening along the longitudinal axis.

8. The assembly of claim 4, further including a sleeve interposed in the bumper opening between the bumper and the shaft.

9. The assembly of claim 8, where the shaft has an outer diameter, the sleeve has an inner diameter, and the outer diameter is less than the inner diameter such that the shall is slidable within the sleeve along the longitudinal axis.

10. The assembly of claim 4, further including a first cap extending from a first end of the shaft at a side of the first resistant member generally facing away from the first side of the bumper, and a second cap extending from an opposing second end of the shaft at a side of the second resistant member generally facing away from the second side of the bumper.

11. The assembly of claim 10, further including a housing, where the first cap contacts the housing, and the first resistant member and the second resistant member are positioned in non-contacting relation to the housing.

12. The assembly of claim 10, further including a housing, where the second cap contacts the housing, and the first resistant member and the second resistant member are positioned in non-contacting relation to the housing.

13. The assembly of claim 10, further including a washer interposed between the first resistant member and the first cap.

14. The assembly of claim 10, further including a washer interposed between the second resistant member and the second cap.

15. The assembly of claim 10, where at least one of the first cap and the second cap is integrated with the shaft as a single-piece construction.

16. The assembly of claim 10, where at least one of the first cap and the second cap is a separate component relative to the shaft and is coupled to the shaft.

17. The assembly of claim 1, where the bumper has a groove circumferentially formed around the bumper relative to the longitudinal axis, and the baffle portion extends into the groove.

18. The assembly of claim 1, where the first resistant member is constructed from a first elastomeric material, the second resistant member is constructed from a second elastomeric material, the bumper is constructed from a third elastomeric material, and at least one of the first, second and third elastomeric materials has a durometer measurement different from the durometer measurements of the other elastomeric materials.

19. The assembly of claim 1, where the first resistant member is constructed from a first elastomeric material, the second resistant member is constructed from a second elastomeric material, the bumper is constructed from a third elastomeric material, and at least one of the first, second and third elastomeric materials has a durometer measurement ranging from about 20 to about 100.

20. The assembly of claim 1, further including a housing having a housing opening and a mounting mechanism, where the bumper has a bumper opening extending through the bumper from the first side to the second side, the first resistant member has a first resistant member opening, the second resistant member has a second resistant member opening, the mounting mechanism extends along the longitudinal axis from the housing opening and through the first resistant member opening, the bumper opening, and the second resistant member opening, and each of the bumper, the first resistant member and the second resistant member is disposed in non-contacting relation to the housing.

21. The assembly of claim 20, further including a cap contacting the first resistant member and the housing and interposed between the first resistant member and the housing, where the cap has a cap opening and the mounting mechanism extends through the cap opening.

22. The assembly of claim 1, where the first resistant member includes a first sidewall defining the first bore, the second resistant member includes a second sidewall defining the second bore, and at least one of the first and second sidewalls has a thickness that varies along the longitudinal axis.

23. The assembly of claim 1, where the first resistant member includes a first sidewall defining the first bore and terminating at a first lip, the first lip contacts the first surface of the baffle, the second resistant member includes a second sidewall defining the second bore and terminating at a second lip, the second lip contacts the second surface of the baffle, and at least one of the first and second sidewalls has a thickness that increases generally in a direction along the longitudinal axis from the corresponding lip away from the bumper.

24. A loudspeaker baffle isolation assembly comprising:

a bumper including a first side, a second side, and an opening formed through the bumper from the first side to the second side;

a first resistant member generally disposed on the first side of the bumper and having a first bore, where at least a portion of the bumper on the first side extends into the first bore and is coaxial with the first bore relative to a longitudinal axis, and the bumper is separate from and spaced from the first resistant member;

a second resistant member generally disposed on the second side of the bumper and having a second bore, where at least a portion of the bumper on the second side extends into the second bore and is coaxial with the second bore relative to the longitudinal axis, and the bumper is separate from and spaced from the second resistant member; and a shaft extending through the bumper opening and into the first bore and the second bore.

25. The assembly of claim 24, further including a loudspeaker baffle, the baffle including a first surface, a second surface, and a baffle portion defining a baffle opening, where the bumper is positioned in the baffle opening and contacts the baffle portion, the first resistant member contacts the first surface, and the second resistant member contacts the second surface.

26. The assembly of claim 24, further including a first cap extending from a first end of the shaft at a side of the first resistant member generally facing away from the first side of the bumper, and a second cap extending from an opposing second end of the shaft at a side of the second resistant member generally facing away from the second side of the bumper.

27. A loudspeaker baffle isolation assembly comprising:

a loudspeaker baffle including a baffle portion defining a baffle opening; and a bumper portion positioned in the baffle opening and contacting the baffle portion, the bumper portion including a first side, a second side, and a bumper opening formed through the bumper along a longitudinal axis from the first side to the second side;

a first resistant portion extending from the first side and contacting a first surface of the baffle, the first resistant portion including a first lip disposed at a distance from the bumper opening and a first sidewall defining a first cavity between the bumper opening and the first lip, the first cavity communicating with the bumper opening; and a second resistant portion extending from the second side and contacting a second surface of the baffle, the second resistant portion including a second lip disposed at a distance from the bumper opening and a second sidewall defining a second cavity between the bumper opening and the second lip, the second cavity communicating with the bumper opening.

28. The assembly of claim 27, further including a loudspeaker housing, where the first resistant portion is interposed between the first surface of the baffle and the housing.

29. The assembly of claim 28, further including a loudspeaker disposed in the loudspeaker housing.

30. The assembly of claim 27, where the bumper portion, the first resistant portion, and the second resistant portion are integrated as a unitary isolation member.

31. The assembly of claim 30, where the unitary isolation member is constructed from an elastomeric material having a durometer measurement ranging from about 20 to about 100.

32. The assembly of claim 27, further including a shaft extending along the longitudinal axis from the first cavity, through the bumper opening and into the second cavity.

33. The assembly of claim 32, further including a loudspeaker housing having a housing opening, where the first resistant portion is interposed between the first surface of the baffle and the housing opening, and where the bumper opening and the housing opening are aligned with each other relative to the longitudinal axis.

34. The assembly of claim 33, where the shaft is hollow.

35. The assembly of claim 32, where the shaft has an outer diameter, the bumper opening has an inner diameter, and the outer diameter is less than the inner diameter such that the shaft is slidable within the bumper opening along the longitudinal axis.

36. The assembly of claim 32, further including a first cap extending from a first end of the shaft at a side of the first resistant portion generally facing away from the first side of the bumper portion, and a second cap extending from an opposing second end of the shaft at a side of the second resistant portion generally facing away from the second side of the bumper portion.

37. The assembly of claim 36, further including a housing, where the first cap contacts the housing, and the first resistant portion and the second resistant portion are positioned in non-contacting relation to the housing.

38. The assembly of claim 36, further including a housing, where the second cap contacts the housing, and the first resistant portion and the second resistant portion are positioned in non-contacting relation to the housing.

39. The assembly of claim 36, where at least one of the first cap and the second cap is integrated with the shaft as a single-piece construction.

40. The assembly of claim 36, where at least one of the first cap and the second cap is a separate component relative to the shaft and is coupled to the shaft.

41. The assembly of claim 27, further including a housing having a housing opening and a mounting mechanism, where the mounting mechanism extends along the longitudinal axis from the housing opening and through the first cavity, the bumper opening, and the second cavity, and each of the bumper, the first resistant portion and the second resistant portion is disposed in non-contacting relation to the housing.

42. The assembly of claim 41, further including a cap contacting the first resistant portion and the housing and interposed between the first resistant portion and the housing, where the cap has a cap opening and the mounting mechanism extends through the cap opening.

43. The assembly of claim 27, where at least one of the first and second sidewalls has a thickness that varies along the longitudinal axis.

44. The assembly of claim 27, where at least one of the first and second sidewalls has a thickness that increases generally in a direction along the longitudinal axis from the corresponding lip toward the bumper portion.

45. A loudspeaker baffle isolation assembly comprising:

a bumper portion including a first side, a second side, and a bumper opening formed through the bumper along a longitudinal axis from the first side to the second side;

a first resistant portion extending from the first side, the first resistant portion including a first lip disposed at a distance from the bumper opening and a first sidewall defining a first cavity between the bumper opening and the first lip, the first cavity communicating with the bumper opening;

a second resistant member extending from the second side, the second resistant portion including a second lip disposed at a distance from the bumper opening and a second sidewall defining a second cavity between the bumper opening and the second lip, the second cavity communicating with the bumper opening; and a shaft extending through the bumper opening and into the first cavity and the second cavity.

46. The assembly of claim 45, further including a loudspeaker baffle, the baffle including a first surface, a second surface, and a baffle portion defining a baffle opening, where the bumper is positioned in the baffle opening and contacts the baffle portion, the first resistant member contacts the first surface, and the second resistant member contacts the second surface.

47. The assembly of claim 45, further including a first cap extending from a first end of the shaft at a side of the first resistant portion generally facing away from the first side of the bumper portion, and a second cap extending from an opposing second end of the shaft at a side of the second resistant portion generally facing away from the second side of the bumper portion.

48. A loudspeaker mounting system comprising:

a housing;

a loudspeaker disposed in the housing;

a baffle including a baffle portion defining a baffle opening, the baffle disposed in non-contacting relation to the housing; and a baffle isolation assembly including:

a bumper positioned in the baffle opening and contacting the baffle portion;

a first resistant member generally disposed on a first side of the bumper and contacting a first surface of the baffle; and a second resistant member generally disposed on a second side of the bumper and contacting a surface of the baffle.

49. The system of claim 48, where the first resistant member has a first bore, at least a portion of the bumper on the first side extends into the first bore and is coaxial with the first bore relative to a longitudinal axis, the second resistant member has a second bore, at least a portion of the bumper on the second side extends into the second bore and is coaxial with the second bore relative to the longitudinal axis, and the bumper is separate from and spaced from the first resistant member and the second resistant member.

50. The system of claim 48, where the bumper has a bumper opening extending through the bumper from the first side to the second side, the first resistant member has a first resistant member opening, the second resistant member has a second resistant member opening, and the assembly further includes a shaft extending along a longitudinal axis from the first resistant member opening, through the bumper opening and into the second resistant member opening.

51. The system of claim 50, further including a cap coupled to the shaft at a side of the first resistant member generally facing away from the first side of the bumper, where the cap contacts the housing and the first resistant member and the second resistant member are positioned in non-contacting relation to the housing.

52. The system of claim 48, where the first resistant member is interposed between the first surface of the baffle and the housing.

53. The system of claim 48, where the first resistant member is constructed from a first elastomeric material, the second resistant member is constructed from a second elastomeric material, the bumper is constructed from a third elastomeric material, and at least one of the first, second and third elastomeric materials has a durometer measurement different from the durometer measurements of the other elastomeric materials.

54. The system of claim 48, where the first resistant member includes a first sidewall defining the first bore, the second resistant member includes a second sidewall defining the second bore, and at least one of the first and second sidewalls has a thickness that varies along the longitudinal axis.

55. The system of claim 48, where the bumper has a bumper opening extending along a longitudinal axis from the first side to the second side, the first resistant member includes a first lip disposed at a distance from the bumper opening and a first sidewall defining a first cavity between the bumper opening and the first lip, the second resistant member includes a second lip disposed at a distance from the bumper opening and a second sidewall defining a second cavity between the bumper opening and the second lip, and the first cavity and the second cavity communicate with the bumper opening.

56. The system of claim 48, where the bumper, the first resistant member, and the second resistant member are integrally provided as a unitary isolation member.

57. The system of claim 48, where the baffle isolation assembly is one of a plurality of baffle isolation assemblies, each assembly including a respective bumper, a first resistant member and a second resistant member, and where the damping characteristic of at least one of the assemblies is different from the respective damping characteristics of the other assemblies.

58. A method for isolating a baffle from a housing in which a loudspeaker is disposed, comprising:

isolating the baffle from the housing against loads in a radial direction by mounting a bumper in a baffle opening of the baffle, where the bumper contacts the baffle and is restricted from moving freely in the radial direction and the bumper does not contact the housing; and isolating the baffle from the housing against loads in a longitudinal direction orthogonal to the radial direction by interposing a first resistant member between a first side of the baffle and the housing where the first resistant member contacts the baffle, providing a second resistant member in contact with an opposing second side of the baffle, and mounting the first resistant member and the second resistant member relative to the baffle such that the first resistant member and the second resistant member are restricted from moving freely in the longitudinal direction.

59. The method of claim 58, where at least one of the first and second resistant members includes a sidewall defining a bore, and the method further comprises varying the thickness of the sidewall.

60. The method of claim 58, further comprising selecting durometer measurements for the bumper, the first resistant member, and the second resistant member based on the loads applied to the bumper, the first resistant member, and the second resistant member.

* * * * *